(12) United States Patent
Maetani et al.

(10) Patent No.: US 8,989,531 B2
(45) Date of Patent: Mar. 24, 2015

(54) OPTICAL-ELECTRICAL WIRING BOARD AND OPTICAL MODULE

(75) Inventors: Maraki Maetani, Kyoto (JP); Masahiko Hirose, Kyoto (JP)

(73) Assignee: Kyocera Corporation, Kyoto (JP)

( * ) Notice: Subject to any disclaimer, the term of this patent is extended or adjusted under 35 U.S.C. 154(b) by 432 days.

(21) Appl. No.: 13/259,460

(22) PCT Filed: Mar. 30, 2010

(86) PCT No.: PCT/JP2010/055744
§ 371 (c)(1),
(2), (4) Date: Sep. 23, 2011

(87) PCT Pub. No.: WO2010/113968
PCT Pub. Date: Oct. 7, 2010

(65) Prior Publication Data
US 2012/0014641 A1  Jan. 19, 2012

(30) Foreign Application Priority Data

Mar. 30, 2009  (JP) .................................. 2009-083740

(51) Int. Cl.
*G02B 6/12* (2006.01)
*G02B 6/43* (2006.01)
(Continued)

(52) U.S. Cl.
CPC ............... *G02B 6/43* (2013.01); *H01S 5/02292* (2013.01); *H01S 5/183* (2013.01); *H05K 1/0245* (2013.01); *H05K 1/0274* (2013.01); *H05K 3/4644* (2013.01); *H05K 2201/09672* (2013.01); *H05K 2201/09972* (2013.01)
USPC .............................................. 385/14; 385/131

(58) Field of Classification Search
CPC ............................... G02B 6/43; H05K 1/0274
USPC .......................................................... 385/14
See application file for complete search history.

(56) References Cited

U.S. PATENT DOCUMENTS 7,230,278 B2 * 6/2007 Yamada et al. .................. 257/80
(Continued)

FOREIGN PATENT DOCUMENTS

JP          01179504          7/1989
(Continued)

*Primary Examiner* — Uyen Chau N Le
*Assistant Examiner* — Chad Smith
(74) *Attorney, Agent, or Firm* — Volpe and Koenig, P.C.

(57) ABSTRACT

The invention relates to an optical-electrical wiring board (2) and an optical module (1). The optical-electrical wiring board (2) includes a substrate (8), a dielectric layer (11), first conductive layers (16a) and second conductive layers (16b). The dielectric layer (11) includes a first region (B) and a second region (C). The first region (B) constitutes a plurality of light transmission portions (11B). The second region (C) has a plurality of pairs of conductive layers each having an overlap portion (10) in which one of the plurality of second conductive layers (16b) and one of the plurality of first conductive layers (16a) overlap each other when seen through in a laminated direction (a) of the dielectric layer (11) and the substrate (8).

9 Claims, 6 Drawing Sheets

(51) Int. Cl.
H01S 5/022 (2006.01)
H01S 5/183 (2006.01)
H05K 1/02 (2006.01)
H05K 3/46 (2006.01)

(56) References Cited

U.S. PATENT DOCUMENTS 7,657,136 B2 * 2/2010 Matsuoka et al. .............. 385/14

2009/0003761 A1 1/2009 Matsuoka et al.
2010/0215313 A1 * 8/2010 Matsuoka et al. .............. 385/14

FOREIGN PATENT DOCUMENTS

| JP | 2000298216 | 10/2000 |
| JP | 2004054003 | 2/2004 |
| JP | 2009055054 | 3/2009 |
| WO | 2005071807 | 8/2005 |
| WO | 2006035499 | 4/2006 |

* cited by examiner

OPTICAL-ELECTRICAL WIRING BOARD AND OPTICAL MODULE

TECHNICAL FIELD

The present invention relates to an optical-electrical wiring board and an optical module.

BACKGROUND ART

Recently, development of an optical wiring board in which part of electrical wires is replaced by optical wires such as optical waveguides is considered. In particular, use of optical waveguides among optical wires is considered because the degree of freedom in designing the shape is higher than that of optical fibers and integrated formation with a conventional electrical wiring board is possible.

For example, optical wiring boards disclosed in Japanese Unexamined Patent Publications JP-A 2000-298216 and JP-A 2004-54003 internally include a core portion that transmits light. Photoelectric conversion elements such as a light-emitting device and a light-receiving device are used for converting signals between the optical wires and the electrical wires.

Furthermore, for example, in a wiring board disclosed in Unexamined Patent Publication JP-A 1-179501 (1989) as an electrical wiring board that operates at a high speed, a pair of differential lines are arranged inside the wiring board with a predetermined gap interposed therebetween in the thickness direction.

However, the optical wires and the electrical wires are arranged in different layers in conventional examples, and, thus, the thickness of the optical-electrical wiring board tends to be large.

SUMMARY OF INVENTION

It is an object of the invention to provide an optical-electrical wiring board and an optical module with a small thickness.

An optical-electrical wiring board according to an embodiment of the invention comprises a substrate, a dielectric layer, and a plurality of pairs of conductive layers. The dielectric layer has a first region and a second region. The first region constitutes a plurality of light transmission portions in an interior thereof. The plurality of pairs of conductive layers are located at the second region. A plurality of overlap portions are provided in which conductive layers constituting each pair of the plurality of pairs of conductive layers overlap each other when seen through in a laminated direction of the dielectric layer and the substrate.

Moreover, an optical module according to an embodiment of the invention comprises the optical-electrical wiring board described above.

BRIEF DESCRIPTION OF DRAWINGS

Other and further objects, features, and advantages of the invention will be more explicit from the following detailed description taken with reference to the drawings wherein.

DESCRIPTION OF EMBODIMENTS

Figure 1:
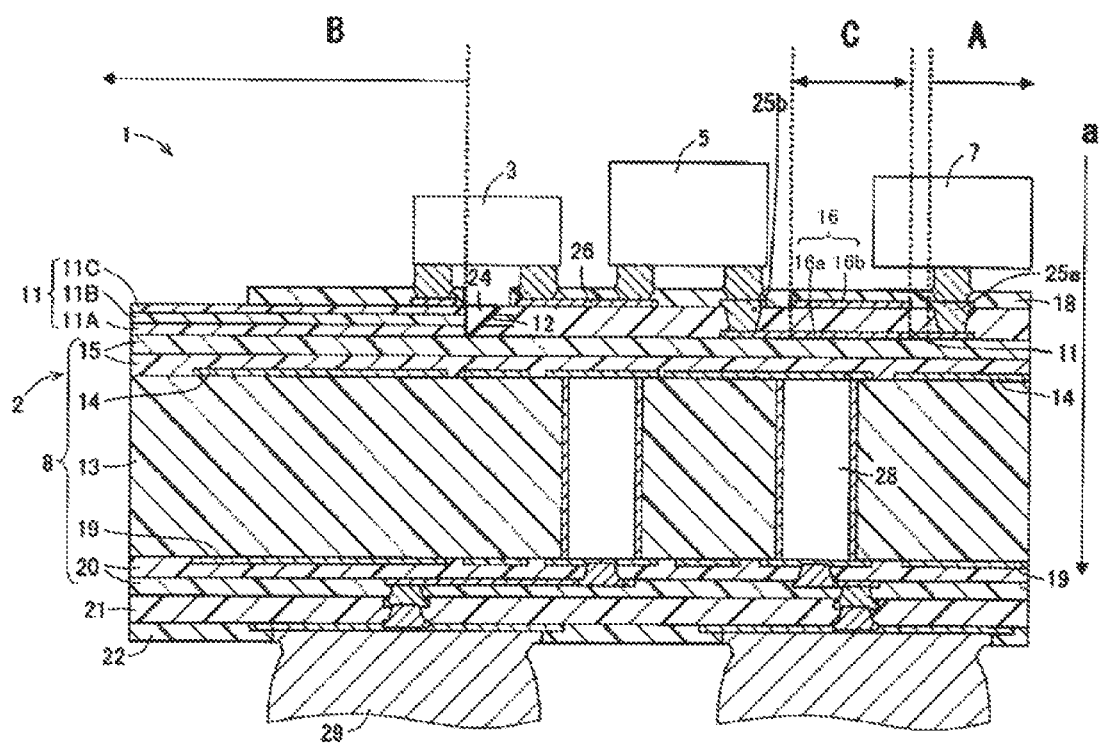
FIG. 1 is a cross-sectional view showing part of the configuration of an optical module 1 according to an embodiment of the invention.

Now referring to the drawings, preferred embodiments of the invention are described below. In the embodiments, portions corresponding to those described in a foregoing embodiment may be denoted by the same reference numerals, and a description thereof may be omitted. In the case where only part of the configuration is described, the other portions of the configuration are similar to those previously described.

<Optical Module>

An the optical module 1 shown in FIG. 1 is configured such that a VCSEL 3 that is a photoelectric conversion element, a driver IC 5 that is a drive circuit element, and an LSI 7 that is an integrated circuit device are mounted on a surface of an optical-electrical wiring board 2. Note that the optical module 1 according to an embodiment of the invention may use a PIN-PD instead of the VCSEL and may use a receiver IC instead of the driver IC. Here, "VCSEL" is an abbreviation of a vertical cavity surface emitting laser, and "PIN-PD" is an abbreviation of a PIN-photo diode.

The VCSEL 3 is driven by the driver IC 5 to emit laser. The operation of the driver IC 5 is controlled by the LSI 7. An electrical signal between the driver IC 5 and the LSI 7 is transmitted through a first conductive layer 16a and a second conductive layer 16b that form a pair. The driver IC 5 is connected to the VCSEL 3 via an electrical wire 26. Furthermore, in the case where a PIN-PD is used instead of the VCSEL and a receiver IC is used instead of the driver IC, an electrical signal based on an optical signal received by a PIN-PD 4 is outputted to a receiver IC 6, and output from the receiver IC 6 is then inputted to the LSI 7.

Here, the optical module 1 shown in FIG. 1 is mounted on another circuit board (not shown) via solder balls 29 on the back face side of the optical module 1. Furthermore, in the case where a substrate 8 is a build-up substrate, electrical connection with a circuit board can be established using a via-conductor 28 or the like that connects conductive layers respectively provided on both main faces of a core substrate 13.

<Optical-Electrical Wiring Board>

In FIG. 1, a dielectric layer 11 is disposed on the substrate 8. Moreover, a plurality of first conductive layers 16a and a plurality of second conductive layers 16b are arranged so as to clip part of the dielectric layer 11. Each of the first conductive layers 16a and each of the second conductive layers 16b form a pair of conductive layers 16.

Figure 2A:
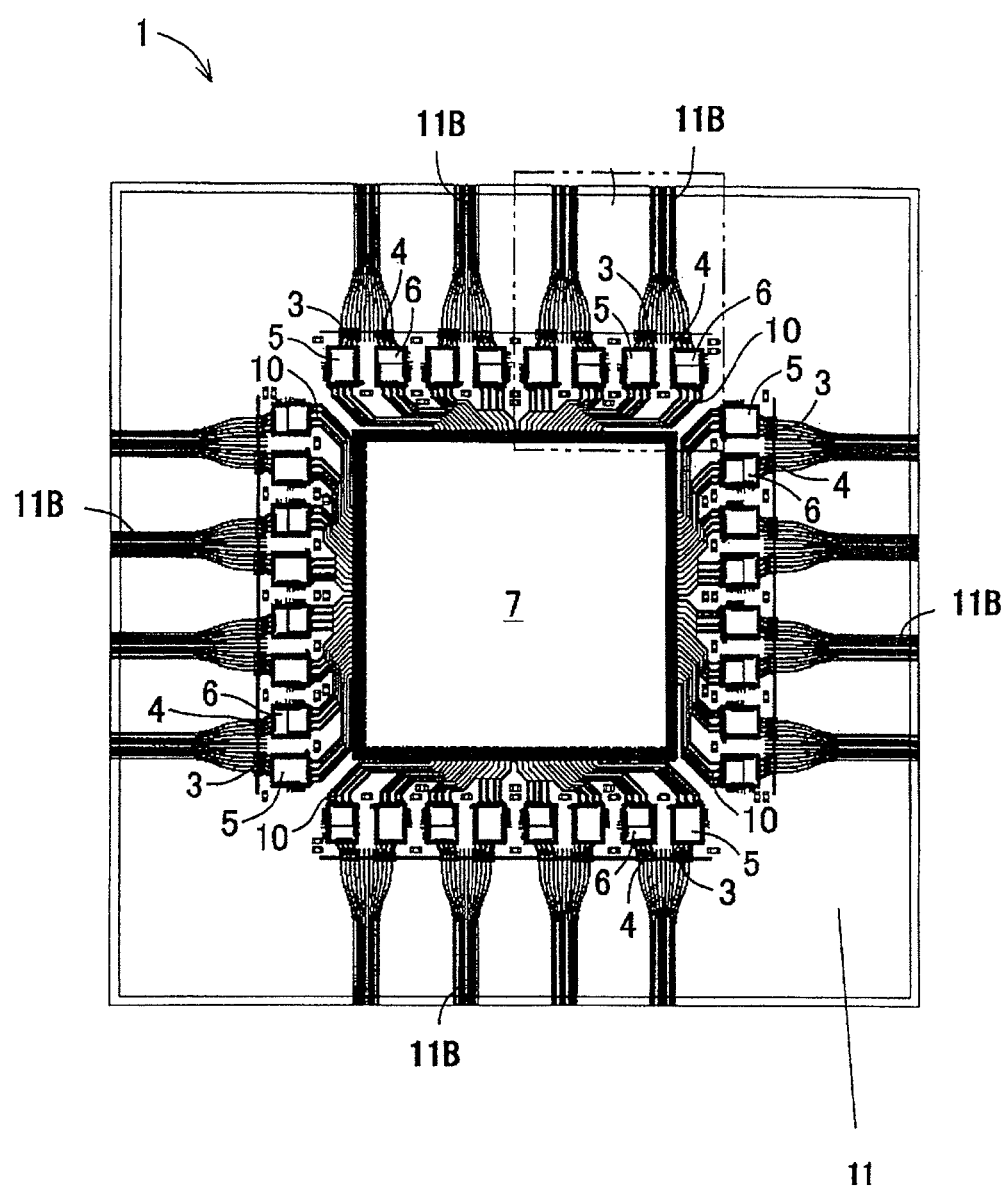
FIG. 2A is a see-through top view showing the entire optical module 1 in FIG. 1.
Figure 2B:
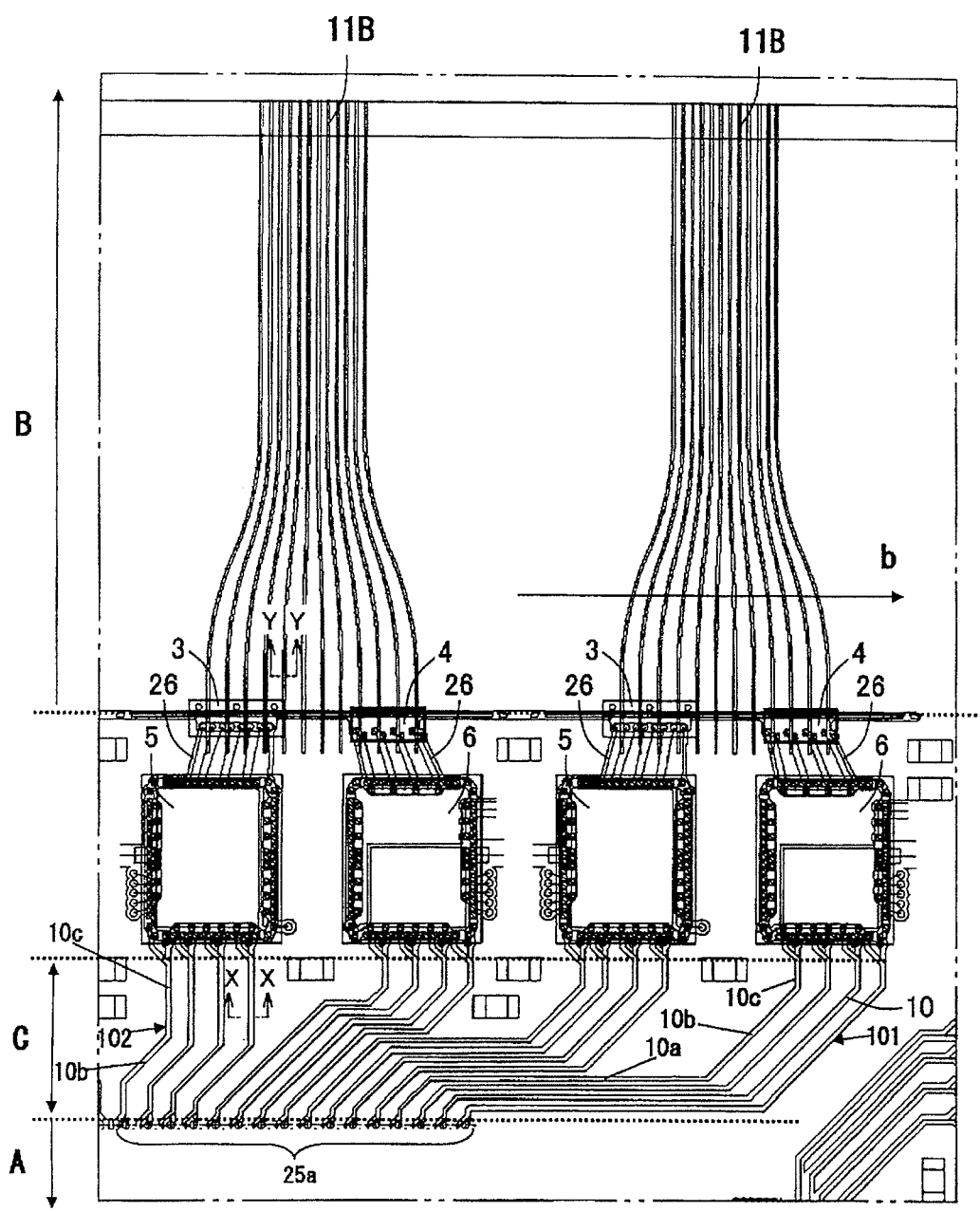
FIG. 2B is a see-through top view showing a region defined by a dotted line in an optical-electrical wiring board 2 from which an integrated circuit device 7 has been removed from the optical module 1 in FIG. 2A.

As shown in FIGS. 1 and 2B, the dielectric layer 11 has a first region B and a second region C.

The first region B refers to a region of the dielectric layer 11 provided with a light transmission portion 11B (see the region indicated by the symbol B shown in FIGS. 1 and 2B). The first region B refers to a region extending up to an end portion of the light transmission portion 11B. Here, a "light transmission portion" refers to a portion that has a refractive index higher than that of portions located therearound in the first region B and that actually transmits light therethrough, and corresponds to a core of the core-clad structure in the optical waveguide structure. Here, on the right side of an optical path changing mirror 12 in FIG. 1, there is a portion that is produced in a similar manner to the light transmission portion 11B and has a refractive index higher than that of portions therearound, but this portion is not included in the light transmission portion 11B because this portion is not actually used for transmission of light. Here, the portions located around the light transmission portion 11B in the first region B refers to low-refractive index portions 11A and 11C in the drawings.

A plurality of light transmission portions 11B are located side by side in a first direction "b" inside the first region B (see FIGS. 2A and 2B).

Figure 2C:
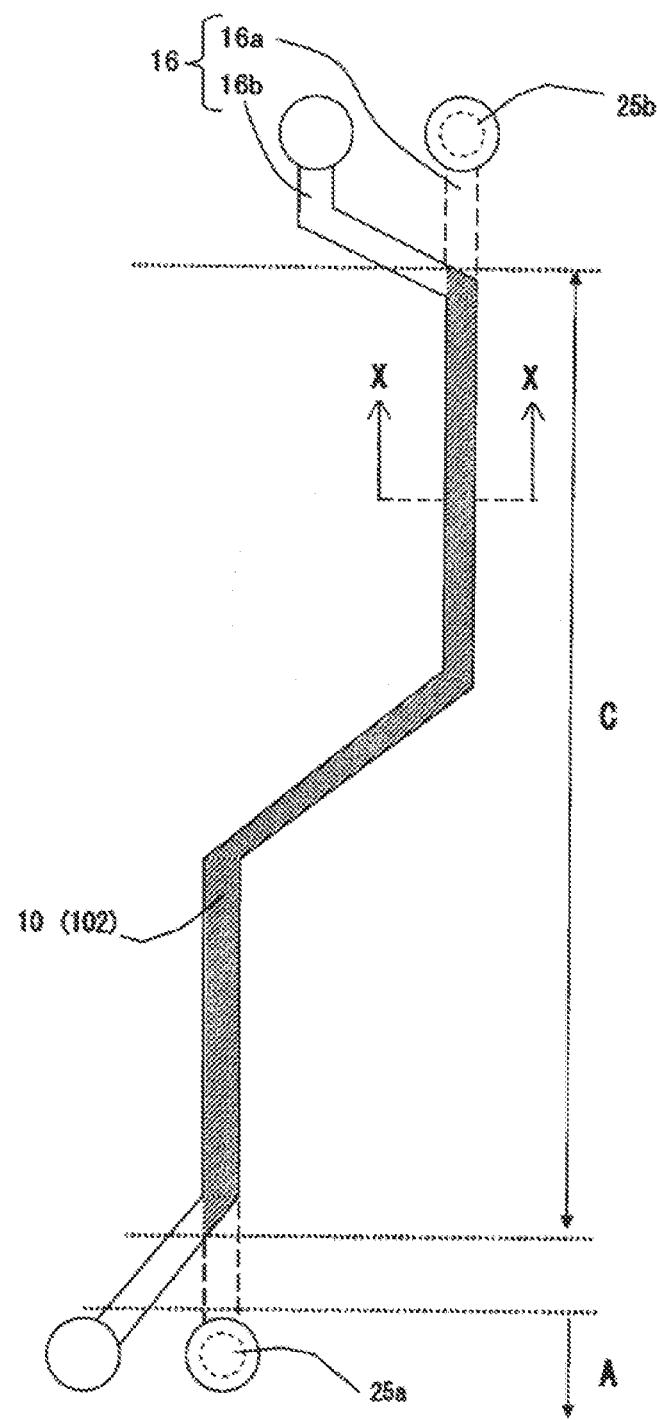
FIG. 2C is a see-through plan view showing a first conductive layer 16a and a second conductive layer 16b including a second overlap portion 102 shown on the leftmost side among overlap portions 10 in FIG. 2B.

The first conductive layer 16a and the second conductive layer 16b at the second region C form a pair of conductive layers 16 as described above (see FIG. 2A), and the pair of conductive layers 16 have an overlap portion 10. The second region C refers to a region of the dielectric layer 11 provided with the overlap portion 10 (see the region indicated by the symbol C shown in FIGS. 2B and 2C). The overlap portion 10 refers to a region in which the second conductive layer 16b and the first conductive layer 16a overlap each other when seen through in a laminated direction of the dielectric layer 11 and the substrate 8 (a direction "a" in FIG. 1). For example, as shown in FIG. 2C, the second region C refers to a region including the overlap portion 10 (102) indicated by hatching (including from one end to the other end of the overlap portion 10).

The dielectric layer 11 preferably further has a third region A. The third region A refers to a region of the dielectric layer 11 provided with a mount portion on which the integrated circuit device 7 is to be mounted. More specifically, the region to which the integrated circuit device 7 is to be attached refers to a region of the dielectric layer 11 provided with a through-conductor 25a that corresponds to a mount portion on which the integrated circuit device 7 is to be mounted.

In the case where the overlap portion 10 is provided at the second region C in this manner, the following effect is obtained.

Figure 3:
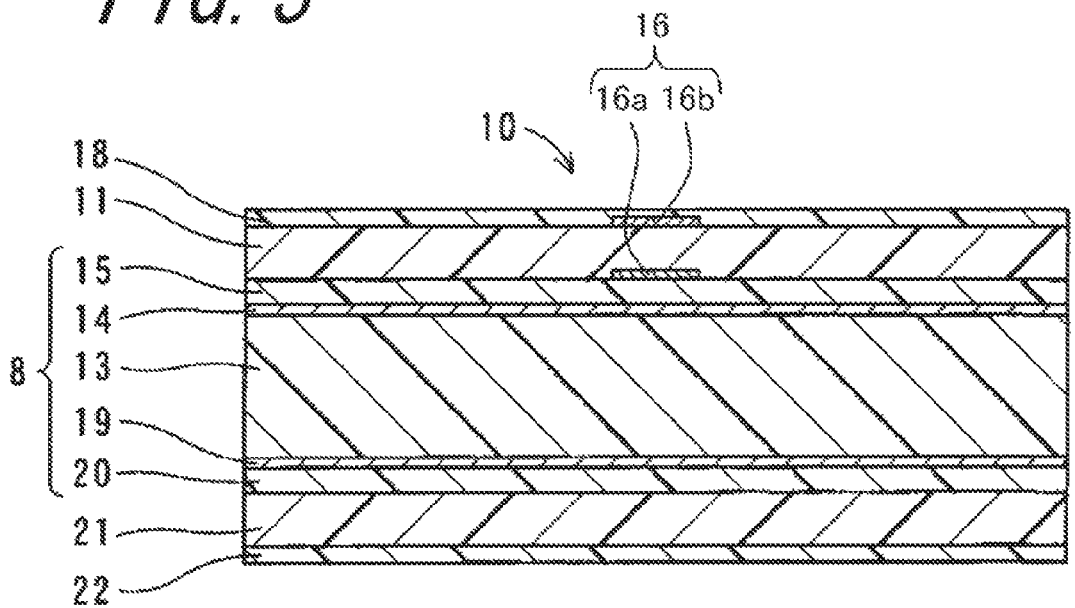
FIG. 3 is a cross-sectional view showing the overlap portion 10 of the first conductive layer 16a and the second conductive layer 16b taken along the line X-X in FIG. 2B.
Figure 5:
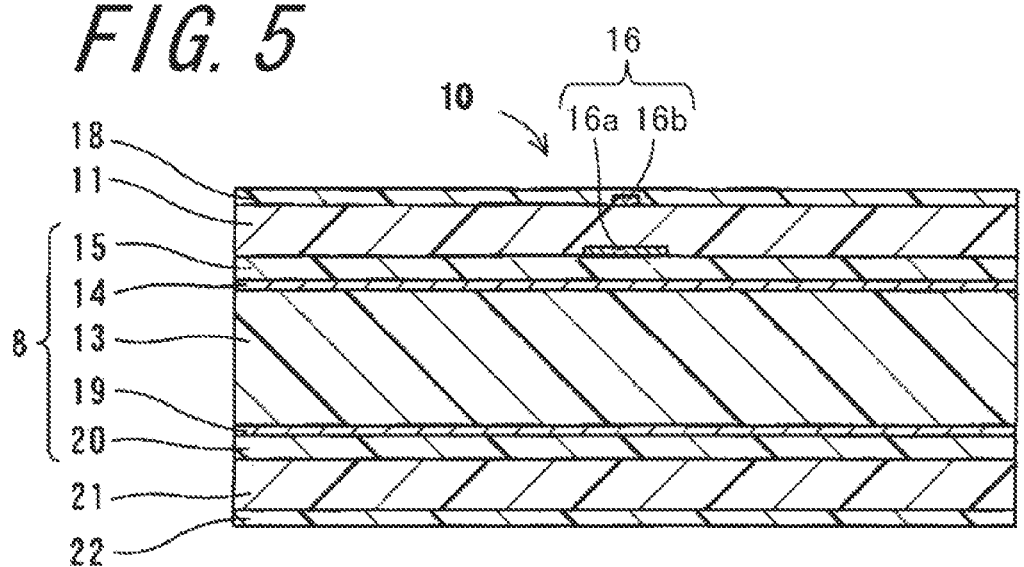
FIG. 5 is a cross-sectional view showing an example of the overlap portion 10 that is a portion in which the first conductive layer 16a and the second conductive layer 16b overlap each other.
Figure 6:
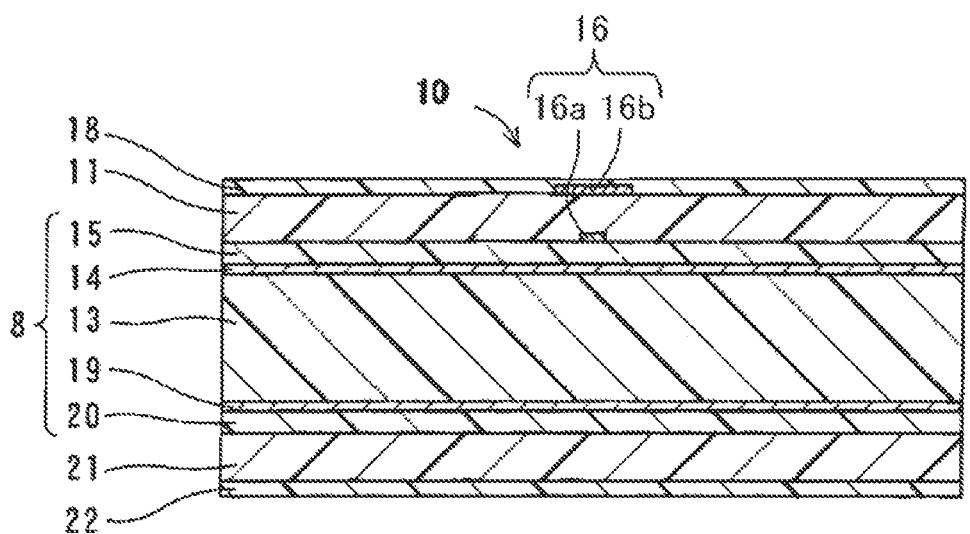
FIG. 6 is a cross-sectional view showing an example of the overlap portion 10 that is a portion in which the first conductive layer 16a and the second conductive layer 16b overlap each other.

In the case where electrical signals having opposite phases are supplied to the first conductive layer 16a and the second conductive layer 16b, intensive electromagnetic coupling can be generated between the first conductive layer 16a and the second conductive layer 16b in the overlap portion 10. In particular, in the case where the first conductive layer 16a and the second conductive layer 16b are arranged oppose to each other so as to clip the dielectric layer 11 as shown in FIG. 3, 5, or 6, more intensive electromagnetic coupling can be obtained. Here, FIGS. 3, 5, and 6 show cross-sections orthogonal to the longitudinal direction of the first conductive layer 16a and the second conductive layer 16b when seen through in the direction "a". In these cross-sections, the width in contact with the dielectric layer 11 is larger than the thickness. In the case of FIGS. 3, 5, and 6, the cross-sections are rectangular, and, thus, the thickness and the width are clearly seen, but, for example, in the case where the cross-sections are in the shape of a mountain, the thickness refers to a length from the bottom to the top of the cross-section.

Furthermore, in the case where the coefficient of thermal expansion of the first conductive layer 16a and the second conductive layer 16b is lower than the coefficient of thermal expansion of the dielectric layer 11 (e.g., in the case where the first conductive layer 16a and the second conductive layer 16b are made of a metal such as copper, and the dielectric layer 11 is made of an organic resin such as epoxy resin), thermal expansion of the dielectric layer 11 can be reduced by causing the first conductive layer 16a and the second conductive layer 16b to clip the second region C of the dielectric layer 11 from above and below to form the overlap portion 10. With the second region C provided between the third region A in which thermal expansion is easily caused by heat from the integrated circuit device 7 and the like and the first region B in which the influence of heat is not preferable because the optical loss increases, transfer of thermal expansion of the dielectric layer 11 from the third region A to the first region B can be reduced. Accordingly, transfer of thermal expansion to the plurality of light transmission portions 11B in the first region B is reduced, and, thus, a decrease in the optical transmission properties can be suppressed.

Moreover, the overlap portions 10 of the pairs of conductive layers 16 preferably extend and are spread each other from the third region A to the first region B as shown in FIG. 2a. Heat transferred from the integrated circuit device 7 to the dielectric layer 11 tends to be radially transferred from the integrated circuit device 7 with similar heat transfer to cause thermal expansion of the dielectric layer 11 radially from the integrated circuit device 7. In the case where the plurality of overlap portions 10 extend and are spread each other from the third region A to the first region B as described above, the overlap portions 10 are arranged along the thermal expansion, and, thus, thermal expansion of the dielectric layer 11 can be sufficiently reduced. In the case of FIG. 2A, the overlap portions 10 are radially arranged, and, thus, the effect of suppressing thermal expansion can be sufficiently obtained.

When seen through in the direction "a" in FIG. 1, each of the overlap portions 10 preferably has a plurality of straight line portions having mutually different longitudinal directions. The plurality of straight line portions include, for example, a first straight line portion 10a, a second straight line portion 10b, and a third straight line portion 10c as shown in FIG. 2b. With at least these three types of straight line portions, the thermal expansion can be sufficiently suppressed. Moreover, sufficient integration of the first conductive layers 16a and the second conductive layers 16b can be achieved.

The first straight line portion 10a refers to an overlap portion that is parallel to the first direction (the direction "b" in FIG. 2B) in which the plurality of light transmission portions are arranged side by side. Here, the meaning of "parallel" can allow an error of ±2°.

The second straight line portion 10b refers to an overlap portion that is inclined with respect to the direction "b". In particular, the angle of inclination is preferably 43 to 47° with respect to the direction "b". Here, the meaning of "inclined" does not include the meaning of "perpendicular" and "parallel".

The third straight line portion 10c refers to an overlap portion that is perpendicular to the direction "b". Here, the meaning of "perpendicular" can allow an error of ±2°.

Among the plurality of overlap portions 10, an overlap portion that is farthest from the center of the integrated circuit device 7 is a first overlap portion 101 (see FIG. 2B), and an overlap portion that is closest to the center of the integrated circuit device 7 is a second overlap portion 102 (see FIG. 2B).

The length of the first straight line portion 10a in the first overlap portion 101 is preferably longer than the length of the first straight line portion 10a in the second overlap portion 102. Here, in FIG. 2B, the second overlap portion 102 is not provided with the first straight line portion 10a. Among the directions in which the dielectric layer 11 is expanded by heat from the integrated circuit device 7, the thermal expansion direction that gives the greatest negative effect to the light transmission portion 11B is a thermal expansion direction that is parallel to the direction "b". In the case where thermal expansion occurs in this direction, the gaps between the plurality of light transmission portions 11B in the dielectric layer 11 in the first region B may change to cause optical crosstalk between the light transmission portions 11B. Since thermal expansion of the dielectric layer 11 is accumulated more as the distance from the center of the integrated circuit device 7, which is a heat generating center, increases, the thermal expansion in the dielectric layer 11 becomes largest. Accordingly, the thermal expansion parallel to the direction "b" also increases. The first overlap portion 10a can exert the greatest effect on suppression of thermal expansion parallel to the direction "b" among the plurality of straight line portions of the overlap portion 10, and, thus, the length of the first straight line portion 10a in the first overlap portion 101 is preferably longer than the length of the first straight line portion 10a in the second overlap portion 102 as described above. For example, in the case where the integrated circuit device 7 is rectangular when viewed from above, the center of the integrated circuit device 7 corresponds to the point of intersection of the diagonal lines.

As shown in FIG. 1, for example, a build-up substrate is used as the substrate 8 in the optical-electrical wiring board 2.

The build-up substrate is configured from the core substrate 13 that functions as a base when forming build-up layers 15 and the build-up layers 15 that clip the core substrate 13 from both main faces thereof. When using a build-up substrate, the same type of layers are formed on both main faces of the core substrate 13 in order to reduce generation of warping of the substrate. In the build-up substrate 8 in FIG. 1, build-up layers 15 and 20 are arranged on both main faces of the core substrate 13. A ground conductor layer 14 or 19 is disposed between the core substrate 13 and the build-up layer 15 or 20.

For example, the core substrate 13 of the build-up substrate 8 has a thickness of 400 to 800 μm, the build-up layers 15 and 20 each have a thickness of 30 to 100 μm, and a single or a plurality of build-up layers are formed on each of both main faces.

Figure 4:
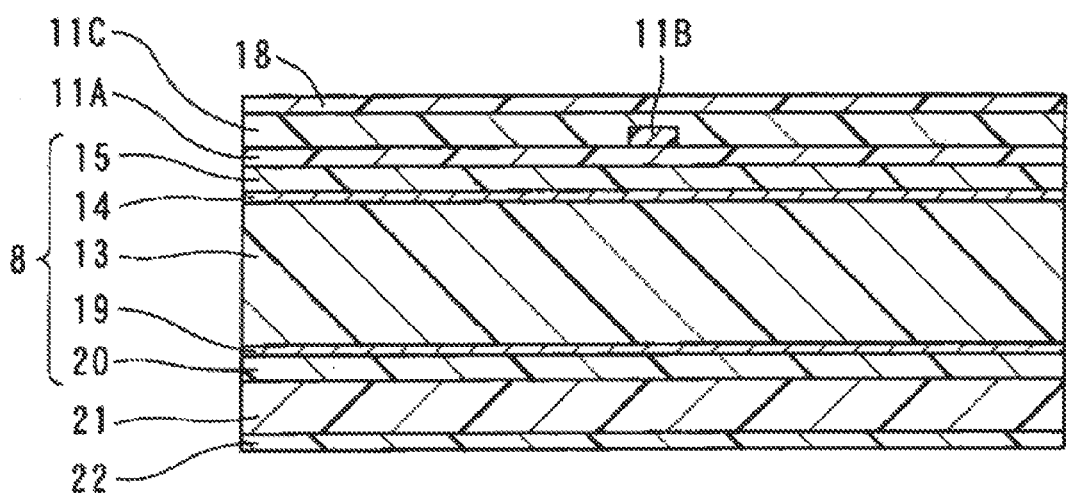
FIG. 4 is a cross-sectional view showing the configuration of a dielectric layer 11 in a first region B taken along the line Y-Y in FIG. 2B.

As shown in FIG. 1 or 4, the first region B in the dielectric layer 11 is configured from the light transmission portion 11B and the low-refractive index portions 11A and 11C that are arranged therearound. Since the refractive index of the light transmission portion 11B is higher than that of the low-refractive index portions 11A and 11C by several percentage or more, an optical signal is confined in the light transmission portion 11B and transmitted with low loss, and the first region B functions as an optical waveguide.

More specifically, the thickness of the low-refractive index portion 11A located under the light transmission portion 11B is approximately 10 to 25 μm, the cross-section of the light transmission portion 11B measures approximately 35 to 50 μm square, the thickness of the low-refractive index portion 11C located over the light transmission portion 11B is approximately 15 to 25 μm, and the layer thickness of the dielectric layer 11 is approximately 60 μm.

Here, the light transmission portion 11B is provided with the optical path changing mirror 12 directly below the VCSEL 3. The optical path changing mirror 12 has an optical path changing face that is inclined with respect to the direction of the optical axis of the light transmission portion 11B. For example, when the optical path changing face is inclined by 45 degrees with respect to the direction of the optical axis of the light transmission portion 11B, the direction of the optical path of light transmitted vertically downward from the VCSEL can be converted by 90 degrees and transmitted into the light transmission portion 11B of the dielectric layer 11.

The optical path changing face is provided on the surface of the optical path changing mirror 12 by cutting the dielectric layer 11 in a direction orthogonal to the main faces of the build-up substrate 8 with a dicing blade having a cross-section at approximately 45 degrees and applying a metal such as gold, silver, copper, aluminum, or nickel to an inclined face at approximately 45 degrees so as to form a thin film.

The width of the plurality of first conductive layers 16a and the plurality of second conductive layers 16b is 35 to 50 μm, and the pitch is 125 μm or less. In this embodiment, a high-frequency signal having a frequency of 10 GHz or higher can be transmitted even through a transmission line having such a narrow wire width and such a small pitch.

The dielectric layer 11 is produced substantially as in the process for producing the build-up substrate 8.

As shown in FIG. 1, the optical-electrical wiring board 2 has an optical via-transmission line 24 from outside the low-refractive index portion 11C located over the light transmission portion 11B to the light transmission portion 11B in order to transmit an optical signal from the VCSEL 3 to the light transmission portion 11B inside the dielectric layer 11. Here, the optical via-transmission line 24 is preferably made of a transparent resin that transmits an optical signal. Light transmitted from the VCSEL 3 passes through the optical via-transmission line 24 and is transmitted via the optical path changing mirror 12 to the light transmission portion 11B.

Furthermore, as shown in FIG. 1, the optical-electrical wiring board 2 has through-conductors 25a and 25b from the outer main face (the boundary between a solder resist layer 18 and the dielectric layer 11) of the dielectric layer 11 to the first conductive layer 16a. The through-conductor 25a is provided in order to transmit an electrical signal from the LSI 7 to the first conductive layer 16a that is disposed between the build-up substrate 8 and the dielectric layer 11, and the through-conductor 25b is provided in order to transmit an electrical signal from the first conductive layer 16a to the driver IC 5.

The transmission loss of optical signals increases as the length of the optical via-transmission line 24 increases, and, thus, the optical via-transmission line 24 is preferably as short as possible. Furthermore, also regarding the through-conductors 25a and 25b, the self inductance of the through-conductors 25a and 25b increases as the length of the through-conductors 25a and 25b increases, and reflection of high-frequency signals increases to increase the transmission loss of the electrical signals, and, thus, the through-conductors 25a and 25b are preferably as short as possible.

Since the low-refractive index portions 11A and 11C, the light transmission portion 11B, and the dielectric layer 11, which have been arranged in different layers in conventional examples, are included in the same layer, both the length of the optical via-transmission line 24 and the length of the through-conductors 25a and 25b can be reduced. Accordingly, the transmission loss of optical signals and electrical signals can be reduced.

In the optical-electrical wiring board 2, for example, the solder resist layer 18 may be provided as another dielectric layer on the second conductive layer 16b. In FIG. 1, the solder resist layer 18 is provided with an opening portion at a position corresponding to connecting lands such that part of the second conductive layer 16b (e.g., connecting lands with the VCSEL 3, the PIN-PD 4, the driver IC 5, the receiver IC 6, and the LSI 7) is exposed. The solder resist layer 18 is formed, for example, by applying a liquid-state material or sticking a film-like material, which are made of a resin material such as epoxy resin, to the surface of the dielectric layer 11.

Generally, the solder resist layer 18 is to prevent a solder from flowing to a position other than a land or a pad when soldering an external electronic component and an electrical wire. Here, in the optical-electrical wiring board 2 of this embodiment, by providing the solder resist layer 18 on the second conductive layer 16b, the electric field at the overlap portion 10 can be confined between the first conductive layer 16a and the second conductive layer 16b, and the electrical coupling of the first conductive layer 16a and the second conductive layer 16b can be increased. The solder resist layer 18 may be made of, for example, a resin material such as epoxy resin.

Ordinarily, a person skilled in the art would think of a configuration in which one dielectric layer having the same thickness as that of the dielectric layer 23 is provided on the second conductive layer 16b, and then a solder resist layer is provided on that dielectric layer.

Meanwhile, the optical-electrical wiring board 2 of this embodiment uses the solder resist layer 18 itself as the dielectric layer, and, thus, the dielectric layer that is ordinarily necessary can be omitted. Thus, the height of the optical-electrical wiring board 2 can be reduced. In particular, in the case where the same type of layers are formed on both main faces of the core substrate 13, for example, in order to prevent the substrate from being warped as described above, the thickness equivalent to two dielectric layers can be reduced. Furthermore, in the case where one dielectric layer having the same thickness as that of the dielectric layer 11 is provided on the second conductive layer 16b, a via-conductor is additionally necessary from the second conductive layer 16b to the driver IC 5 or the LSI 7, but, by using the solder resist layer 18 itself as the dielectric layer, no via-conductor is necessary from the second conductive layer 16b to the driver IC 5 or the LSI 7 as shown in FIG. 1.

As shown in FIGS. 1 and 3, the build-up substrate 8 has the ground conductor layer 14 between the core substrate 13 and the build-up layer 15. In the case where the build-up substrate 8 has the ground conductor layer 14, the relationship of the relative permittivities of the solder resist layer 18 and the dielectric layer 23 can change the width of the first conductive layer 16a and the width of the second conductive layer 16b as below. The width herein refers to the width of the first conductive layer 16a or the second conductive layer 16b in contact with the dielectric layer 11.

The optical-electrical wiring board 2 shown in FIG. 5 is as in the embodiment shown in FIG. 3, except that the width of the second conductive layer 16b is smaller than the width of the first conductive layer 16a.

At that time, the relative permittivity of the solder resist layer 18 is larger than the relative permittivities of the build-up layers 15 and the optical waveguide layer 11. For example, the relative permittivity of the solder resist layer 18 is approximately 4.0, the relative permittivity of the build-up layers 15 is approximately 3.3, and the relative permittivity of the dielectric layer 11 is approximately 2.4.

In the case where the relative permittivity of the solder resist layer 18 is large, the capacitive components of the second conductive layer are increased, and, thus, the characteristic impedance of the second conductive layer becomes smaller than that of the first conductive layer. In order to eliminate such a difference in the characteristic impedances to match the characteristic impedances of the first conductive layer and the second conductive layer, in the case of FIG. 5, the wire width of the second conductive layer 16b is reduced to increase the inductance components. When the inductance components of the second conductive layer 16b are increased, a decrease in the characteristic impedance caused by an increase in the capacitive components can be suppressed, and a difference between the characteristic impedances of the first conductive layer 16a and the second conductive layer 16b can be eliminated.

The optical-electrical wiring board 2 shown in FIG. 6 is as in the embodiment shown in FIG. 3, except that the width of the second conductive layer 16b is larger than the width of the first conductive layer 16a.

At that time, it is assumed that the conditions of the relative permittivity of the solder resist layer 18 are as in FIG. 5 described above.

In the case where the relative permittivity of the solder resist layer 18 is small, the capacitive components of the second conductive layer are reduced, and, thus, the characteristic impedance of the second conductive layer becomes larger than that of the first conductive layer. In order to eliminate such a difference in the characteristic impedances to match the characteristic impedances of the first conductive layer 16a and the second conductive layer 16b, in the case of FIG. 6, the wire width of the second conductive layer 16b is increased to reduce the inductance component. When the inductance components of the second conductive layer 16b are reduced, an increase in the characteristic impedance caused by reduction of the capacitive components can be suppressed, and a difference between the characteristic impedances of the first conductive layer 16a and the second conductive layer 16b can be eliminated.

As described above, in the case where the wire width of the first conductive layer 16a and the wire width of the second conductive layer 16b are made different from each other, for example, even when laminated layers are displaced from each other during production of the optical-electrical wiring board 2 or use of the optical-electrical wiring board 2, the overlap portion 10 of the first conductive layer 16a and the second conductive layer 16b when viewed from above can be secured, and these layers can be sufficiently coupled to each other.

In FIG. 2A, a plurality of driver ICs 5 and a plurality of receiver ICs 6 are arranged so as to surround the LSI 7 (the gap between the driver IC 5 or the receiver IC 6 and the LSI 7 is approximately several millimeters). Furthermore, a plurality of VCSELs 3 and a plurality of PIN-PDs 4 are arranged on the side opposite to the LSI 7 with respect to the driver ICs 5 and the receiver ICs 6 (the gap between the driver IC 5 and the VCSEL 3 or the gap between the receiver IC 6 and the PIN-PD 4 is desirably 1 mm or less). In this manner, the LSI 7, the driver ICs 5 and the receiver ICs 6, and the VCSELs 3 and the PIN-PDs 4 are located such that the LSI 7 is placed at the center, and the driver ICs 5 and the receiver ICs 6 are located on the outer periphery thereof, and the VCSELs 3 and the PIN-PDs 4 are further located on the outer periphery thereof. With such a positional relationship, signals can be transmitted and received in every direction from the central LSI 7. Furthermore, the light transmission portions 11B and the overlap portions 10 can be integrated within a limited range that is, for example, 45 mm long and 45 mm wide, and dense signals (e.g., 1 Tbps) can be transmitted and received.

As shown in FIG. 2B, four light transmission portions 11B are connected to one VCSEL 3. Furthermore, four electrical wires 26 corresponding to these four light transmission portions 11B are arranged between one driver IC 5 and one VCSEL 3. Moreover, four pairs of first conductive layers 16a and second conductive layers 16b corresponding to these four electrical wires 26 are arranged between one driver IC 5 and one LSI 7.

In order to integrate the plurality of light transmission portions 11B and the plurality of pairs of the first conductive layers 16a and the second conductive layers 16b, both the pitch between the light transmission portions 11B and the pitch between the overlap portions 10 are reduced (e.g., the pitch between the light transmission portions 11B is reduced to 250 µm or less, and the pitch between the overlap portions 10 is reduced to 125 µm or less).

<Method for Producing the Optical-Electrical Wiring Board>

Hereinafter, an example of a method for producing the optical-electrical wiring board 2 will be described.

First, the first conductive layers 16a are patterned on a main face of the build-up substrate that is used as the substrate 8. Next, the dielectric layer 11 is laminated using epoxy resin so as to cover the first conductive layers 16a. Here, in the laminating process of the dielectric layer 11, the light transmission portions 11B and the low-refractive index portions 11A and 11C are formed in the first region B in the dielectric layer 11. An epoxy resin film is laminated on the low-refractive index portion 11A and is then cured through exposure to light according to the pattern of waveguides and developed, to form a plurality of light transmission portions 11B.

Next, through-holes are formed through the dielectric layer 11, and the inner peripheral faces of the through-holes are plated, to form the through-conductors 25a and 25b.

The second conductive layers 16b are patterned on the dielectric layer 11 to form the overlap portions 10 with the first conductive layers 16a. Then, the solder resist layer 18 is placed so as to cover the dielectric layer 11 and the second conductive layers 16b, and openings are formed at positions corresponding to connecting lands of the second conductive layers 16b.

In this manner, the optical-electrical wiring board 2 is obtained. Moreover, the semiconductor devices of the VCSELs 3, the PIN-PDs 4, the driver ICs 5, the receiver ICs 6, and the LSI 7 are mounted on the surface of the optical-electrical wiring board 2, to form the optical module 1. The optical-electrical wiring board 2 and each semiconductor device are electrically connected to each other by connecting a connection pad of each semiconductor device and a connecting land of the second conductive layer 16b using a connecting conductor such as a solder ball via the opening of the solder resist layer 18.

REFERENCE SIGNS LIST

1: Optical module
2: Optical-electrical wiring board
3: VCSEL
4: PIN-PD
5: Driver IC
6: Receiver IC
7: LSI
8: Substrate
10: Overlap portion
101: First overlap portion
102: Second overlap portion
10a: First straight line portion
10b: Second straight line portion
10c: Third straight line portion
11: Dielectric layer
11A: Low-refractive index portion located below light transmission portion 11B
11B: Light transmission portion
11C: Low-refractive index portion located above light transmission portion 11B
16: Pair of conductive layers
16a: First conductive layer
16b: Second conductive layer
25a, 25b: Through-conductor
a: Laminated direction of dielectric layer 11 and substrate 8
b: Direction of plurality of light transmission portions 11B located side by side
A: Third region
B: First region
C: Second region

The invention claimed is:

1. An optical-electrical wiring board, comprising:
a substrate;
a dielectric layer disposed on a main face of the substrate, the dielectric layer comprising a first region and a second region, the dielectric layer configured to constitute a plurality of light transmission portions in the first region; and
a plurality of pairs of electrically conductive layers located at the second region, wherein
a plurality of overlap portions are provided in which conductive layers constituting each pair of the plurality of pairs of electrically conductive layers overlap each other, when viewed in a laminated direction of the dielectric layer and the substrate, the laminated direction being perpendicular to the main face of the substrate,
the dielectric layer further comprises a third region that is located such that the second region is disposed between the third region and the first region, and the plurality of overlap portions extend from the third region toward the first region, and
a distance between two adjacent overlap portions of the plurality of overlap portions increases as the two adjacent overlap portions approach a side of the first region, when viewed in the laminated direction.

2. The optical-electrical wiring board according to claim 1, wherein a coefficient of thermal expansion of each conductive layer of the plurality of pairs of electrically conductive layers is lower than a coefficient of thermal expansion of the dielectric layer.

3. The optical-electrical wiring board according to claim 1, wherein
each conductive layer of the plurality of pairs of electrically conductive layers has a longitudinal direction when seen through in the laminated direction, and
in a cross-section of the each conductive layer orthogonal to the longitudinal direction, a length of the each conductive layer in a width direction in contact with the dielectric layer is longer than a length thereof in the laminated direction.

4. The optical-electrical wiring board according to claim 1, wherein the third region comprises a mount portion configured to mount an integrated circuit device thereon.

5. The optical-electrical wiring board according to claim 1, wherein the plurality of overlap portions each comprises a plurality of straight line portions comprising mutually different longitudinal directions.

6. The optical-electrical wiring board according to claim 5, wherein
the plurality of light transmission portions are located side by side in a first direction, and the plurality of straight line portions each comprise:
- a first straight line portion that is parallel to the first direction;
- a second straight line portion that is inclined with respect to the first direction; and
- a third straight line portion that is perpendicular to the first direction.

7. The optical-electrical wiring board according to claim 6, wherein
the plurality of overlap portions comprise a first overlap portion and a second overlap portion, and
the first overlap portion is located farthest from a center of the integrated circuit device among the plurality of overlap portions, the second overlap portion is located closest to the center among the plurality of overlap portions, and a length of the first straight line portion in the first overlap portion is longer than a length of the first straight line portion in the second overlap portion.

8. The optical-electrical wiring board according to claim 1, wherein
the plurality of pairs of electrically conductive layers comprise a plurality of first conductive layers, and a plurality of second conductive layers that are located such that the second region is clipped between the plurality of second conductive layers and the plurality of first conductive layers,
the plurality of first conductive layers are located between the substrate and the second region, and
the optical-electrical wiring board further comprises a plurality of through conductors that are electrically connected to both end portions of each of the plurality of first conductive layers and that are located so as to pass through both main faces of the dielectric layer.

9. An optical module, comprising:
the optical-electrical wiring board according to claim 1;
an integrated circuit device that is mounted on a mount portion of the optical-electrical wiring board and connected to the plurality of pairs of electrically conductive layers;
a plurality of photoelectric conversion elements that are each optically coupled to at least one of the plurality of light transmission portions; and
a plurality of drive circuit elements that are each electrically connected to at least one of the plurality of photoelectric conversion elements, and electrically connected to the integrated circuit device via at least one pair of the plurality of pairs of electrically conductive layers.

* * * * *